US008598673B2

(12) United States Patent
Joshi et al.

(10) Patent No.: US 8,598,673 B2
(45) Date of Patent: Dec. 3, 2013

(54) LOW-NOISE LARGE-AREA PHOTORECEIVERS WITH LOW CAPACITANCE PHOTODIODES

(75) Inventors: Abhay M. Joshi, New Hope, PA (US); Shubhashish Datta, Princeton, NJ (US)

(73) Assignee: Discovery Semiconductors, Inc., Ewing, NJ (US)

( * ) Notice: Subject to any disclaimer, the term of this patent is extended or adjusted under 35 U.S.C. 154(b) by 369 days.

(21) Appl. No.: 12/806,868

(22) Filed: Aug. 23, 2010

(65) Prior Publication Data

US 2012/0043584 A1  Feb. 23, 2012

(51) Int. Cl.
*H01L 31/105* (2006.01)

(52) U.S. Cl.
USPC ............... 257/448; 257/458; 257/E31.062

(58) Field of Classification Search
USPC ................. 257/448, 458, E31.062
See application file for complete search history.

(56) References Cited

U.S. PATENT DOCUMENTS

| | | | | |
|---|---|---|---|---|
| 3,714,491 A * | 1/1973 | McIntyre et al. | | 257/458 |
| 4,366,377 A * | 12/1982 | Notthoff et al. | | 257/446 |
| 4,403,397 A * | 9/1983 | Bottka et al. | | 438/66 |
| 4,857,982 A * | 8/1989 | Forrest | | 257/186 |
| 4,906,583 A * | 3/1990 | Kagawa et al. | | 438/91 |
| 5,053,837 A * | 10/1991 | Tonai | | 257/458 |
| 5,214,276 A * | 5/1993 | Himoto et al. | | 250/214.1 |
| 5,332,919 A * | 7/1994 | Fujimura | | 257/434 |
| 5,714,773 A * | 2/1998 | Burrows et al. | | 257/82 |
| 7,936,038 B2 * | 5/2011 | Jeong et al. | | 257/458 |
| 2001/0042869 A1 * | 11/2001 | Fujimura | | 257/225 |
| 2002/0025597 A1 * | 2/2002 | Matsuda | | 438/57 |
| 2003/0178636 A1 * | 9/2003 | Kwan et al. | | 257/186 |
| 2005/0118743 A1 * | 6/2005 | Maeng et al. | | 438/57 |
| 2005/0194654 A1 * | 9/2005 | Iguchi | | 257/458 |
| 2006/0105554 A1 * | 5/2006 | Inada | | 438/558 |
| 2011/0024863 A1 * | 2/2011 | Koi et al. | | 257/438 |

OTHER PUBLICATIONS

Frank J. Effenberger and Abhay M. Joshi; "Ultrafast, Dual-Depletion Region, InGaAS/InP p-i-n Detector"; IEEE Journal of Lightwave Technology; vol. 14, No. 8; Aug. 1996; pp. 1859-1864.

Frank J. Effenberger and Abhay M. Joshi; "Ultrafast InGaAS pin detector for eyesafe LIDAR," Part of SPIE Conference on Laser Radar Technology and Applications III, Orlando, Florida; Apr. 1998; SPIE vol. 3380, 0277-786X98; pp. 144-150.

(Continued)

*Primary Examiner* — Steven J Fulk (74) *Attorney, Agent, or Firm* — Watov & Kipnes, P.C.; Kenneth Watov (57) ABSTRACT

A quad photoreceiver includes a low capacitance quad InGaAs p-i-n photodiode structure formed on an InP (100) substrate. The photodiode includes a substrate providing a buffer layer having a metal contact on its bottom portion serving as a common cathode for receiving a bias voltage, and successive layers deposited on its top portion, the first layer being drift layer, the second being an absorption layer, the third being a cap layer divided into four quarter pie shaped sections spaced apart, with metal contacts being deposited on outermost top portions of each section to provide output terminals, the top portions being active regions for detecting light. Four transimpedance amplifiers have input terminals electrically connected to individual output terminals of each p-i-n photodiode.

37 Claims, 9 Drawing Sheets

(56) References Cited

OTHER PUBLICATIONS

V. Wand, J. Bogenstahl, C. Braxmaier, K. Danzmann, A. Garcia, F. Guzmán, G. Heinzel, J. Hough, O. Jennrich, C. Killow, D. Robertson, Z. Sodnik, F. Steier, and H. Ward; "Noise sources in the LTP heterodyne interferometer"; Institute of Physics Publishing; Classical and Quantum Gravity 23, 2006; pp. S159-S167.

Abhay Joshi, Shubhashish Datta, and Don Becker; "GRIN Lens Coupled Top-Illuminated Highly Linear InGaAS Photodiodes"; IEEE Photonics Technology Letters, vol. 20, No. 17, Sep. 1, 2008; pp. 1500-1502.

Abhay Joshi and Shubhashish Datta; "Dual InGaAs Photodiodes Having High Phase Linearity for Precise Timing Applications"; IEEE Photonics Technology Letters, vol. 21, No. 19, Oct. 1, 2009; pp. 1360-1362.

\* cited by examiner

LOW-NOISE LARGE-AREA PHOTORECEIVERS WITH LOW CAPACITANCE PHOTODIODES

GOVERNMENT INTEREST

This invention was made with government support under U.S. (Agency) Contract No. NNX09CD48P awarded by the NASA/Goddard Space Flight Center. The government has certain rights in the invention.

FIELD OF THE INVENTION

The present invention relates to semiconductor devices, and more particularly, to both photoreceivers, and to p-i-n photodiodes.

BACKGROUND OF THE INVENTION

Quad photoreceivers typically include a 2×2 array of p-i-n photodiodes with each photodiode followed by a transimpedance amplifier (TIA). Such quad photoreceivers are used in many applications, such as long baseline interferometry, free-space optical communication, missile guidance, and biomedical imaging and spectroscopy, which rely on free-space optical propagation with position and/or direction sensing capability. It is desirable to increase the active area of quad photoreceivers (and photodiodes) to enhance the link gain, and therefore sensitivity, of the system. However, the resulting increase in the photodiode capacitance reduces the bandwidth of the photoreceiver and adds to the equivalent input current noise, especially at high frequencies, for a given voltage noise level of the TIA.

In fact, the capacitance of the photodiode and its excess current noise arising therefrom, scales linearly as the device area, thereby negating the corresponding increase in the link gain. Owing to this contradiction, the front-end quad photoreceiver can limit the sensitivity of the overall system. An example of such an application is the Laser Interferometry Space Antenna (LISA), which proposes to detect gravity waves in space by measuring distance with ~10 μm/√Hz accuracy over a baseline of five million kilometers. The present invention, as described herein relative to quad photoreceivers, is applicable for use in LISA which requires use of low-noise large-area photoreceivers, based on low-capacitance large-area photodiodes, for free space applications.

In LISA, the optical local oscillator (LO) power incident on each photoreceiver quadrant will be restricted to 100 μW to minimize the power requirements and thermal fluctuations for high pathlength stability. Assuming a photodiode responsivity of 0.7 A/W at 1064-nm wavelength, the desired shot noise-limited system operation requires the photoreceiver to display an equivalent input current noise density of <4.7 pA/√Hz per quadrant. For 0.9-A/W photodiode responsivity at 1550-nm wavelength, an equivalent input current noise density of <5.4 pA/√Hz is needed. Currently, LISA's sensitivity is restricted by the noise arising from 20- to 25-pF capacitance per quadrant demonstrated by typical 1-mm-diameter InGaAs quad photodiodes.

Accordingly, there is a need for photoreceivers having associated low capacitance photodiodes to achieve enhanced sensitivity. There is also a need for low capacitance photodiodes for many other applications that can be provided individually or in an array. The present inventors urge that such applications include systems relying on coherent optical detection, such as LISA, as well as those utilizing direct detection.

SUMMARY OF THE INVENTION

A quad photoreceiver for a first embodiment of the invention includes four p-i-n photodiodes formed on a common $n^+$ doped InP (100) substrate serving as a buffer layer with a bottom metal layer contact providing a common cathode for receiving a bias voltage, a first i-InP drift layer is deposited on the buffer layer, followed by an i-InGaAs absorption layer, followed by an InP cap layer divided into four spaced apart $p^+$-doped sections, with the $p^+$ doping extending into a top most underlying portion of the absorption layer. Each cap section quadrant has $p^+$ metal contacts deposited on top outermost portions thereof to serve as respective output terminals, and the top portions of each quadrant providing an active region responsive to light signals. Four transimpedance amplifiers have individual input terminals electrically connected to the output terminals of each cap section quadrant, respectively.

A second embodiment of the invention includes an individual p-i-n photodiode formed as in the above-described first embodiment of the invention, for applications requiring low capacitance photodiodes.

A third embodiment of the invention includes a photoreceiver comprising a single p-i-n photodiode of the second embodiment driving a TIA.

A fourth embodiment of the invention includes an array of at least two of the low capacitance p-i-n photodiodes of the first embodiment.

BRIEF DESCRIPTION OF THE DRAWINGS

The following drawings are illustrative of embodiments of the present invention and are not intended to limit the invention as encompassed by the claims forming part of the application.

DETAILED DESCRIPTION OF THE INVENTION

The present invention is directed to a quad photoreceiver based on low-capacitance quad photodiodes each followed by a transimpedance amplifier. In one embodiment of the present invention, there is provided a 1-mm-diameter InGaAs quad photodiode having 2.5-pF capacitance per quadrant. In conjunction with low-noise field effect transistor (FET)-input operational amplifiers, the associated low-capacitance quad photodiodes are each designed to provide a quad photoreceiver having an equivalent input current noise density of less than 3.2 pA/√Hz per quadrant up to a 3-dB bandwidth of ~20 MHz. This constitutes up to ~17-dB improvement in sensitivity over a quad photodiode having 20-pF capacitance per quadrant.

Figure 1:
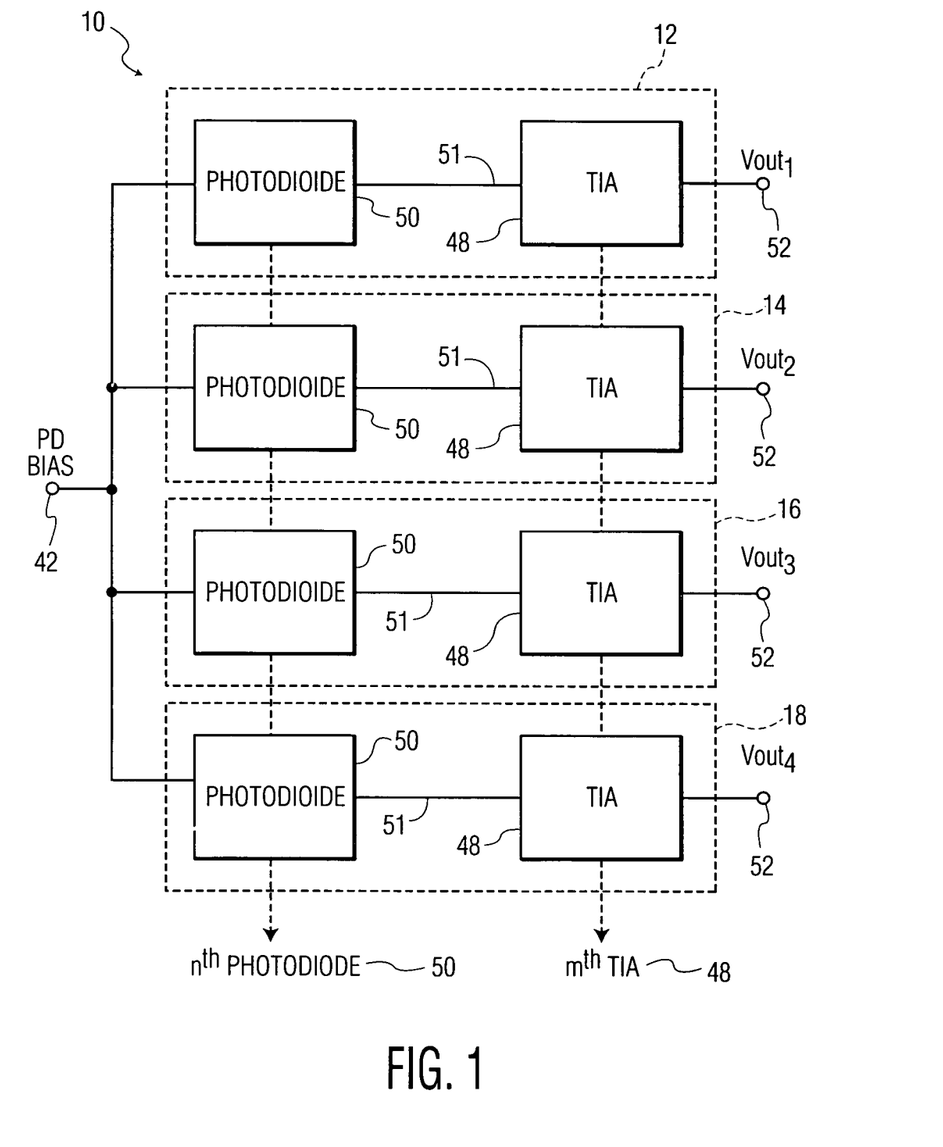
FIG. 1 is a schematic block diagram of a quad photoreceiver for one embodiment of the present invention.

Referring to FIG. 1, a schematic block diagram of a quad photoreceiver 10 is shown for one embodiment of the present invention. The quad photoreceiver 10 includes four quadrants or sections 12, 14, 16, and 18 each having a photodiode 50 followed by a transimpedance amplifier (TIA) 48, and an output terminal (Vout) 52 for supplying an output signal from each quadrant 12, 14, 16 or 18, and a common input terminal 42 for providing a common cathode to supply a bias voltage to each of the photodiodes 50. Each of the transimpedance amplifiers 48 includes individual input terminals electrically connected to the output terminals of each photodiode 50, respectively, via a conductor 51. In one embodiment of the present invention, the photodiodes 50 of the quadrants 12, 14, 16, or 18 are fabricated from a quad InGaAs photodiode array 60 (see FIGS. 3A-3B) as will be described hereinafter. It is noted that the photoreceiver 10 of the present invention is shown having four quadrants for purposes of description and is not limited to such a number. Thus, the present invention is intended to encompass embodiments of at least one quadrant or a plurality of quadrants.

FIG. 1 is also extended to show an array of photodiodes 50 up to a limit of n (value of n=2, 3, 4, . . . ), coupled individually to associated transimpedance amplifiers 48 up to a limit of m (value of m=2, 3, 4, . . . ), respectively. In this manner an array of photoreceivers 10 can be provided. Also, a single photodiode 50 can be provided a bias voltage, and used to drive a single TIA 48 for providing a photoreceiver (n=1, m=1).

Figure 2:
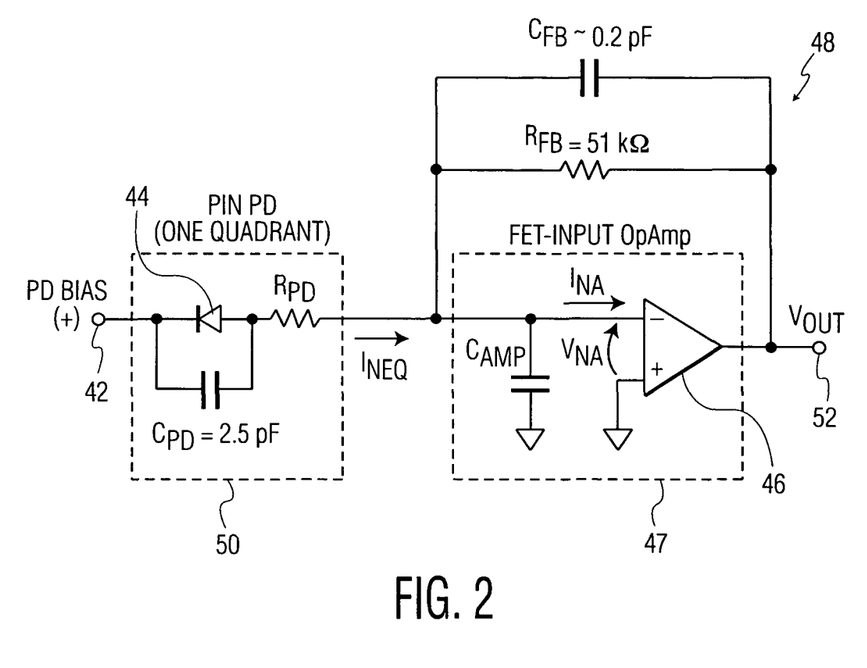
FIG. 2 is an equivalent circuit diagram representing one quadrant of the quad photoreceiver of FIG. 1 showing key design parameters useful for calculating equivalent current noise in accordance with the present invention.

Referring to FIG. 2, an equivalent circuit of a single quadrant 12, 14, 16, or 18 of the quad photoreceiver 10 of FIG. 1 is shown with key design parameters useful for calculating equivalent current noise in accordance with the present invention. Each quadrant 12, 14, 16, or 18 includes a p-i-n photodiode 50 electrically coupled at its output terminal to the input terminal of an associated transimpedance amplifier (TIA) 48.

Each photodiode 50 further includes an input terminal 42 for providing a common cathode to receive a bias voltage, a diode 44 connected in parallel to a capacitor $C_{PD}$, and a resistor $R_{PD}$ having one end connected to the common connection of the anode of diode 44 and capacitor $C_{PD}$.

The TIA 48 includes a 51-k·Ω) feedback resistance $R_{FB}$ and ~0.2 pF of feedback capacitance $C_{FB}$ in conjunction with an FET-Input operational amplifier (OpAmp) 47. An output end resistor $R_{PD}$ is connected to the inverting input of amplifier 46. A suitable example of the OpAmp 47 is an ADA4817 FET-input operational amplifier commercially available from Analog Devices, Inc. of Norwood, Mass. The nominal OpAmp 47 parameters, relevant for noise calculations, include input voltage noise density $V_{NA}$=4 nV/√Hz, input current noise density $I_{NA}$=2.5 fA/√Hz, and input capacitance $C_{AMP}$=1.4 pF. The photodiode 50 of the quadrant 12, 14, 16 or 18 is characterized by its capacitance $C_{PD}$ and series resistance $R_{PD}$ (~10Ω). The quad photoreceiver 10 was assembled in a standard TO-3 package for device testing.

Figure 3A:
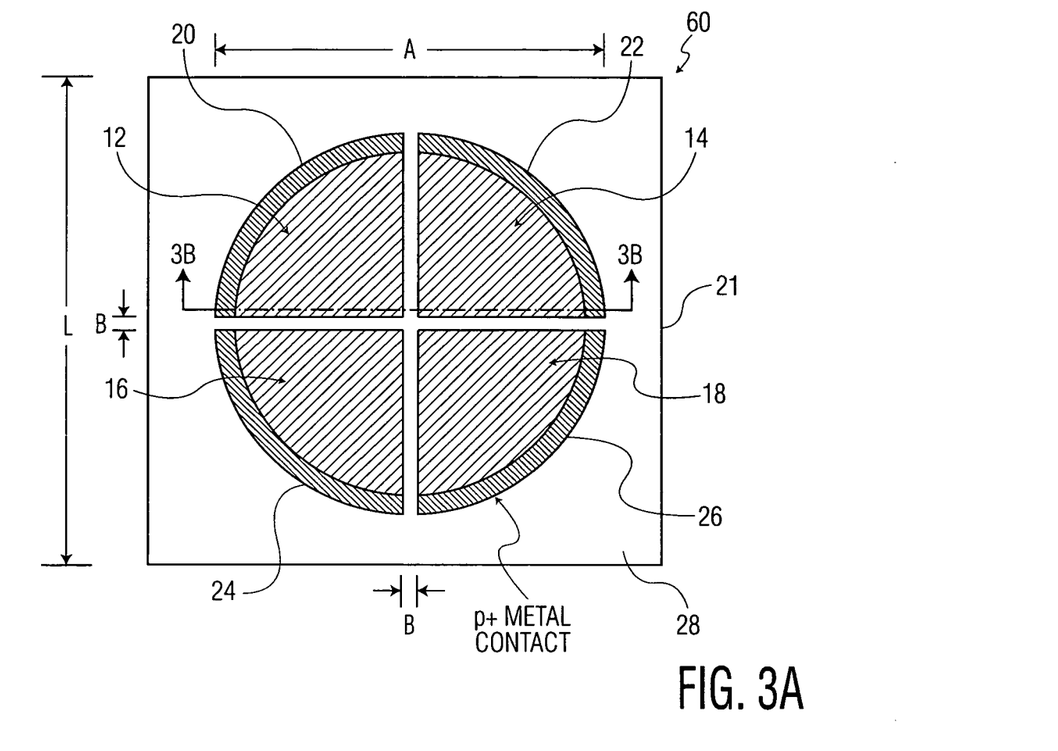
FIG. 3A is a top plan view of a quad photodiode array with an anti-reflection coating removed for one embodiment of the present invention.
Figure 3B:
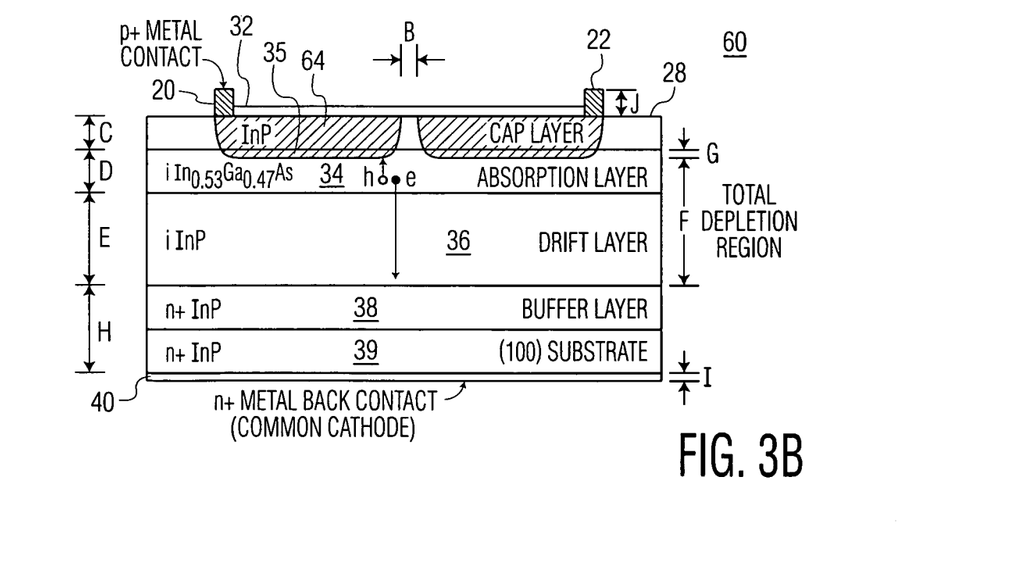
FIG. 3B is a cross sectional view of the quad photodiode array taken along lines 3B-3B of FIG. 3A with the anti-reflection coating applied in accordance with the present invention.

Referring to FIGS. 3A and 3B, a quad photodiode array 60 including a quad InGaAs photodiode structure is shown for one embodiment of the present invention. The quad photodiode array 60 is based on the top-illuminated dual-depletion region (DDR) design. The quad photodiode array 60 includes four p-i-n photodiodes 50 formed on a common n⁺ InP (100) substrate 39 with a buffer layer 38 of thickness H deposited thereon. A metal layer contact 40 is deposited on the bottom of the substrate 39 to provide a common cathode for receiving a bias voltage, a first i-InP drift layer 36 of thickness E deposited on the buffer layer 38, followed by an i-InGaAs absorption layer 34 of thickness D, followed by an InP cap layer 28 of thickness C divided into four p⁺-doped quarter pie sections or quadrants 12, 14, 16, and 18, each with an active region 64 having p⁺ doping extending into a top most underlying portion 35 of the absorption layer 34, each serving as a photodiode 50. The combination of the absorption layer 34 and the drift layer 36 forms a total depletion region of thickness F. Note that the buffer layer 38 can be provided as part of or integral with substrate 39, thereby saving a deposition step.

The quadrants 12, 14, 16, and 18 are characterized by a diametric size A where each quadrant 12, 14, 16, or 18 is spaced from one another by length B. An anti-reflection coating 32 of predetermined thickness overlays the top portions of the active regions 64, and consists of a silicon nitride material in this example. Other examples of suitable anti-reflection coating include, for example, silicon dioxide.

Each cap section or quadrant 12, 14, 16, and 18 has a p⁺ metal contact 20, 22, 24, and 26, respectively, deposited on top outermost portions thereof to serve as respective output terminals. The top portions of each quadrant 12, 14, 16, or 18 provide active regions 64 responsive to light signals. Each of the p-doped active areas 64 of the quadrants 12, 14, 16, and 18 together with metal contacts 20, 22, 24, and 26, the absorption layer 34, the drift layer 36, the buffer layer 38, and metal back contact 40, operates as a single p-i-n junction photodiode 50 shown in FIG. 2. Four transimpedance amplifiers 48 (not shown) include individual input terminals electrically connected to the output terminals in the form of the metal contacts 20, 22, 24, and 26, of each cap section or quadrant 12, 14, 16, or 18, respectively.

In one embodiment of the present invention, the cap layer 28 is composed of indium phosphide (InP). The absorption layer 34 is composed of intrinsic (i) $In_{0.53}Ga_{0.47}As$. The drift layer 36 is composed of intrinsic indium phosphide (i InP). The buffer layer 38 is composed of n⁺ doped indium phosphide. The quad active area 64 of the cap layer 28 and the upper portion 35 of the absorption layer 34 is p$^+$ doped to a desired acceptor concentration through Zn diffusion.

The dual-depletion region (DDR) structure provided by the absorption layer 34 and drift layer 36 of a quad prototype photodiode array 60, in this example, provides high-speed (i.e., low-capacitance) operation in a top-illuminated geometry by balancing the transit times of electrons and holes with the aid of the InP drift layer 36. The epitaxial growth was carried out in a metal-organic chemical vapor deposition (MOCVD) reactor on an n$^+$ doped InP substrate 38. Standard planar processes were used to define diameter A as a 1-mm-diameter quad active area 64 with 20-µm separation B between the adjacent quadrants 12, 14, 16, and 18. Note that the present invention is not meant to be limited to an array of quad photodiodes, but is meant to cover single large area low capacitance photodiodes, and arrays of two or more such photodiodes in accordance with the present invention.

The DDR structure shown in FIG. 3B contains a 2-µm-thick (thickness D) $In_{0.53}Ga_{0.47}As$ absorption layer 34, of which the top 0.5 µm (depth G) forming the quad active area 64 was p$^+$ doped to an acceptor concentration of about $1 \times 10^{18}$ cm$^{-3}$ through Zn diffusion. Combined with an 8-µm-thick (thickness E) intrinsic InP drift region 36, a total depletion width of 9.5 µm (width F) can be achieved at high reverse bias. The buffer layer 38 thickness H is typically 0.5 µm and can be otherwise varied in thickness. The n$^+$ metal back contact 40 thickness I, and the p$^+$ metal contacts 20, 22, 24, 26 thickness J is typically 0.2 µm. The anti-reflection coating is optimized for the light wavelength of interest, and if silicon nitride, a thickness of about 130 nm permits efficient passage of a wavelength of 1064 nm, for example. Each side of DDR structure 62 has a length L sufficient to accommodate the diameter A of the quad active area 64, in this example.

The dimensions given are preferred. However within practical limits the dimensions for large area photodiodes of the present invention can range for A from about 0.1 mm to 10 mm, B from about 5 to 50 µm, C from about 0.1 to 1.0 µm, D from about 1 to 3 µm, E from about 1 to 10 µm, and G from about 0.1 to 0.5 µm. Note that the cross sectional view of the quad photodiode of FIG. 3B, in this example, was fabricated using a standard planar process. As would be known to one of skill in the art, other processing can be utilized such as mesa processing to define the photodiode 60.

The dark current and the capacitance of each quadrant 12, 14, 16, 18 of the quad photodiode 50 were measured using a precision source meter (Keithley 2400) and a capacitance-voltage (CV) meter (HP 4284A), respectively. Each quadrant 12, 14, 16, 18 of the packaged quad photodiode array 10 was characterized as follows. The center of the quadrant 12, 14, 16, 18 was illuminated with a single-tone modulated 1550-nm wavelength optical signal and its conversion gain was recorded using a 50-Ω radio-frequency (RF) spectrum analyzer (Agilent E4440A). To prevent the OpAmp 46 from overloading, an additional 50-Ω series resistor was used between the photoreceiver quadrant output and the RF spectrum analyzer. The same spectrum analyzer was used to measure the output voltage noise density of the photoreceiver quadrant. The equivalent input current noise density for each photoreceiver quadrant 12, 14, 16, 18 was computed from the corresponding output noise and conversion gain measurements. These measurements were performed at room temperature without any active cooling.

For a given active area, the capacitance of a p-i-n photodiode 50 can be reduced by increasing the width F of its depletion region (see FIG. 3B). In a conventional InGaAs—InP photodiode structure, the entire depletion region is usually comprised of low bandgap $In_{0.53}Ga_{0.47}As$ ($E_g$=0.74 eV) absorbing material. However, the low bandgap material in the conventional photodiode structure increases the dark current of the conventional photodiode by enhancing the band-to-band tunneling and generation-recombination current. Consequently, such a design is not optimal for low-noise applications. In the DDR photodiode structure 62, shown in FIG. 3B, the thickness of the intrinsic $In_{0.53}Ga_{0.47}As$ absorption layer 34 is dictated by the quantum efficiency requirements and is restricted to 1.5 µm (thickness D minus thickness G). The majority of the intrinsic region forming the total depletion region F is comprised of the 8-µm-thick high bandgap InP (Eg=1.35 eV) drift layer 36, thereby minimizing the photodiode's dark current, in this example.

Figure 4A:
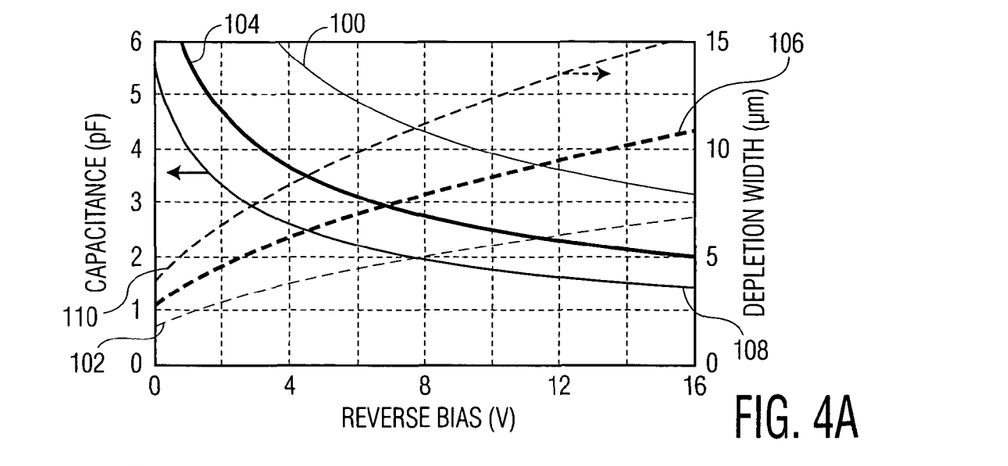
FIG. 4A is a plot showing calculated depletion width and capacitance per quadrant of the quad photoreceiver as a function of reverse bias and n-type background doping in accordance with the present invention.

It is also necessary to maintain a low unintentional background doping level to ensure that this intrinsic or depletion region F is depleted at a reasonable photodiode bias. Referring to FIG. 4A, the plot demonstrates that a depletion width F of 9.2 µm can be achieved at 5-V reverse bias for an n-type background doping concentration of $1 \times 10^{14}$ cm$^{-3}$. Such a depletion width F will result in 2.4-pF capacitance per quadrant ($C_{PD}$) in a 1-mm diameter quad photodiode. Achieving the same depletion width F at elevated levels of background doping will require higher reverse bias voltage. Also, with further reference to FIG. 4A, curve 100 shows capacitance for one quadrant of photodiode 60 for background doping of $5 \times 10^{14}$ cm$^{-3}$; curve 102 depletion width for one quadrant of photodiode 60 for background doping of $5 \times 10^{14}$ cm$^{-3}$; curve 104 shows capacitance for one quadrant of photodiode 60 for background doping of $2 \times 10^{14}$ cm$^{-3}$; curve 106 shows depletion width for one quadrant of photodiode 60 for background doping of $2 \times 10^{14}$ cm$^{-3}$; curve 108 shows capacitance for one quadrant of photodiode 60 for background doping of $1 \times 10^{14}$ cm$^{-3}$; and curve 110 shows depletion width for one quadrant of photodiode 60 for background doping of $1 \times 10^{14}$ cm$^{-3}$.

Figures 4B, 4C:
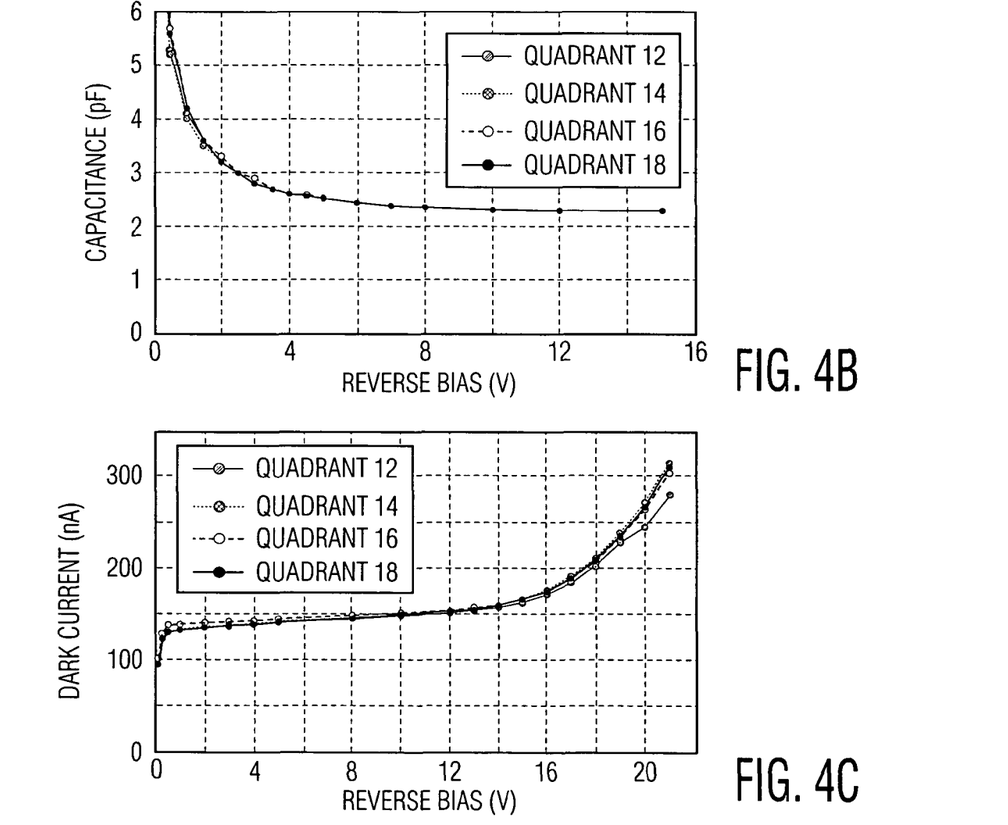
FIG. 4B is a plot showing measured capacitance per quadrant of the quad photoreceiver as a function of reverse bias in accordance with the present invention.
FIG. 4C is a plot showing dark current per quadrant of the quad photoreceiver as a function of reverse bias in accordance with the present invention.

Referring to FIG. 4B, the quad photodiode reported here had ($C_{PD}$=2.5 pF at 5-V reverse bias, therefore implying an n-type background doping of ~$1 \times 10^{14}$ cm$^{-3}$ in the intrinsic region. Referring to FIG. 4C, each photodiode quadrant demonstrated a dark current, $I_{DARK}$=140 nA at 5 V reverse bias. Such dark current leads to a shot noise density of 0.2 pA/√Hz, which is negligible as compared to other noise sources discussed below.

Figure 5A:
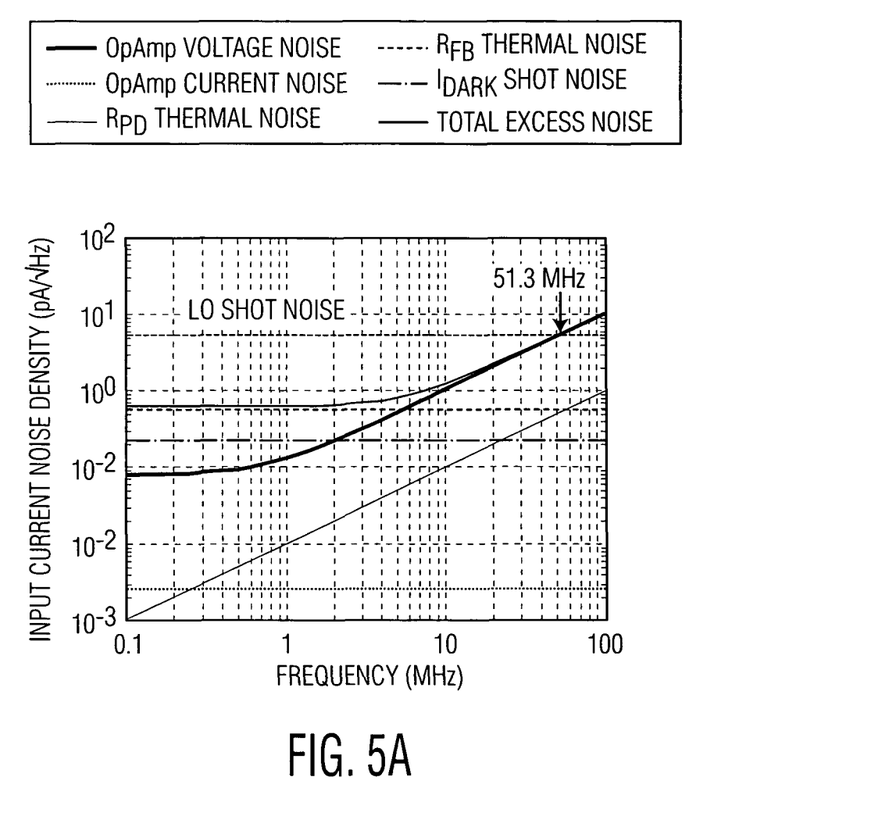
FIG. 5A is a plot showing calculated equivalent input current noise density for a quad photoreceiver employing a quad photodiode having a 2.5 pF capacitance per quadrant in accordance with the present invention.
Figure 5B:
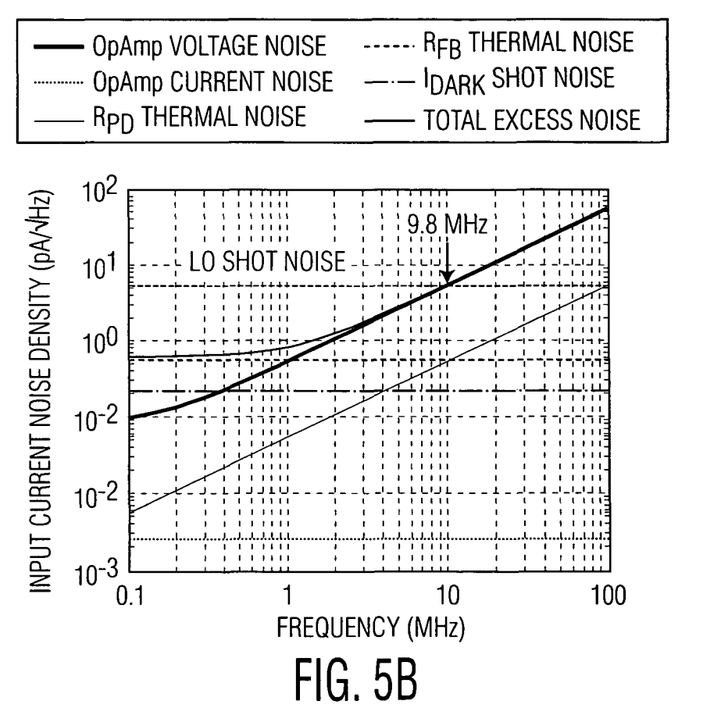
FIG. 5B is a plot showing calculated equivalent input current noise density for a quad photoreceiver employing a quad photodiode having a 20 pF capacitance per quadrant in accordance with the present invention.

The equivalent input current noise density $I_{NEQ}$ of the quad photodiode 50 in each quadrant 12, 14, 16, 18, as shown in FIG. 2, arises from a combination of the voltage noise and current noise of the OpAmp 47, thermal noise from the series resistance of the photodiode 50, thermal noise from the feedback resistance $R_{FB}$, and shot noise due to the dark current of the photodiode 50. These noise sources are statistically independent and combine in quadrature and represented by Equation (I) as follows:

$$I_{NEQ}(f) = \sqrt{V_{NA}^2\left(\frac{1}{R_{FB}^2} + 4\pi^2 f^2 (C_{PD} + C_{AMP})^2\right) + I_{NA}^2 + \left[4\pi f (C_{PD} + C_{AMP})\sqrt{k_B T R_{PD}}\right]^2 + \frac{4k_B T}{R_{FB}} + 2q I_{DARK}} \quad (I)$$

where T is the absolute temperature, kB is the Boltzman's constant, and q is the charge of an electron (see FIG. 1C for other definitions). FIG. 5A displays these noise components and the resulting $I_{NEQ}$ for $C_{PD}$=2.5 pF. The values of the other parameters used in these calculations have been given above. The equivalent noise for $C_{PD}$=20 pF is also given in FIG. 5B for comparison. It is evident that $I_{NEQ}$ is limited by the thermal noise from the feedback resistor $R_{FB}$ at low frequencies ($I_{NEQ}$=0.6 pA/√Hz for $R_{FB}$=51kΩ at 300 K). At high frequencies, $I_{NEQ}$ is dominated by the input voltage noise of the OpAmp 47 with $C_{PD}+C_{AMP}$ as the load. Therefore, reduction in the capacitance of the quad photodiodes 50 leads to lower noise in the quad photoreceiver 10. Comparison of the noise of the photoreceiver 10 with the shot noise for 100-μW LO power and 0.9 A/W photodiode 50 responsivity further demonstrates the relevance of low-capacitance quad photodiodes 50 (see FIGS. 5A and 5B).

Figure 6A:
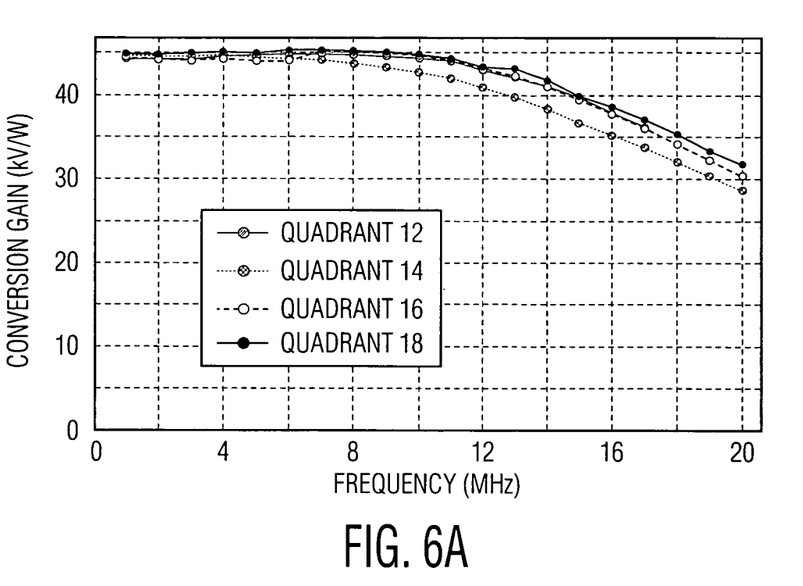
FIG. 6A is a plot showing measured conversion gain at 1550-nm wavelength per quadrant of the quad photoreceiver in accordance with the present invention.
Figure 6B:
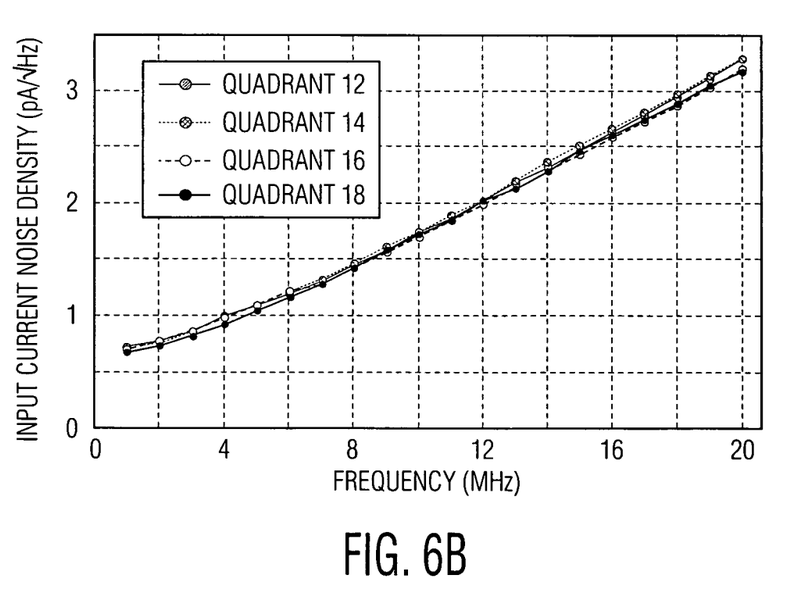
FIG. 6B is a plot showing measured equivalent input current noise density per quadrant of the photoreceiver based on a low noise FET input OpAmp in accordance with the present invention.

Referring to FIG. 6A, owing to the 51-k·Ω feedback resistance $R_{FB}$ and the measured photodiode 50 responsivity of 0.9 A/W at 1550-nm wavelength, for each photoreceiver quadrant 12, 14, 16, 18 demonstrated a conversion gain of 45 kV/W with a 3-dB bandwidth of ~20 MHz. The ~0.5-dB discrepancy between the conversion gains of the four quadrants 12, 14, 16, and 18 can be attributed to the device-to-device variations in the parameters of the OpAmp 47. Referring to FIG. 6B, all photoreceiver quadrants 12, 14, 16, 18 demonstrated an equivalent input current noise density of <3.2 pA/√Hz up to 20-MHz frequency. The frequency dependence of the photoreceiver noise confirms the dominance of the voltage noise contribution of the OpAmp 47. For a $C_{AMP}$=1.4 pF used in this work, the quad photodiode 44 with $C_{PD}$=2.5 pF allows a 14.5-dB improvement in sensitivity over a quad photodiode 50 having 20-pF capacitance per quadrant. This improvement can increase up to 17 dB as the input capacitance of the OpAmp 47 is further reduced to <0.5 pF.

Figure 7:
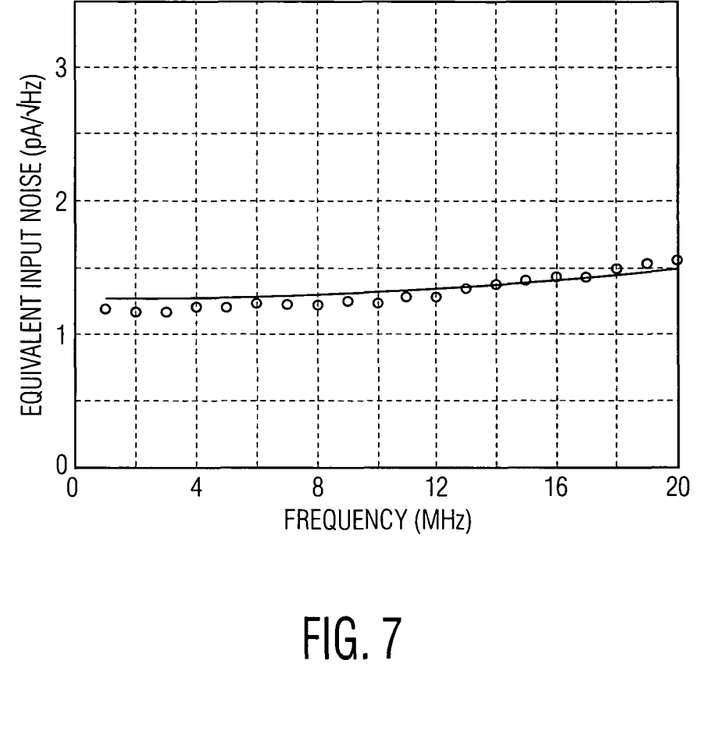
FIG. 7 is a plot showing measured equivalent input current noise density for one quadrant of a 1-mm diameter quad photoreceiver based on a low noise bipolar input OpAmp with the solid black line showing the theoretical simulation, while the open circles show the actual measured results.

Applicants have demonstrated a 1-mm-diameter quad InGaAs photodiode having 2.5-pF capacitance per quadrant at 5-V reverse bias. This performance was enabled by the DDR photodiode structure 62. This quad photodiode array 60 was leveraged to develop a quad photoreceiver having an equivalent input current noise density of <3.2 pA/√Hz per quadrant up to a 3-dB bandwidth of 20 MHz. With reference to FIG. 7, a plot is shown from test results for measured excess equivalent noise for one quadrant of a 1 mm diameter quad photoreceiver (see FIGS. 1, 2, 3A and 3B) based on an EL5131 operational amplifier. The solid black curve shows the theoretical simulation, whereas the open small circles show the actual measured results.

Applicants also used the quad photodiode 60 of FIG. 3B in combination with a low noise bipolar input operational amplifier part number EL5131, manufactured by Intersil of Milpitas, Calif. Quad photodiode 60 was used to drive the EL5131 operational amplifier having the same equivalent circuit as shown in FIG. 2. In laboratory tests the EL5131 OpAmp resulted in a PIN-TIA excess equivalent input noise of less than 1.6 pA/√Hz over a frequency range of up to 20 MHz. The resultant noise versus frequency curve is shown in FIG. 7. Other embodiments can include integrated TIA chips, TIAs based on discrete transistors, and any combination of the above. Applicants urge that there are many other uses for the low capacitance photodiode as presented herein, whether as a single present photodiode, or an array of the present photodiodes, such as the quad example described above.

The present invention also includes a number of other embodiments in addition to a quad InGaAs photodiode coupled to quad TIAs for providing a quad photoreceiver. Other embodiments include a low capacitance p-i-n photodiode alone as described above, and an array of two or more of such photodiodes. In addition, still other embodiments include the use of a p-i-n photodiode as described above for driving one TIA to provide an improved photoreceiver. Also, as previously noted, the present inventive photodiode may have use in other applications than described herein requiring such a low capacitance photodiode for improved or enhanced operation.

Figure 8A:
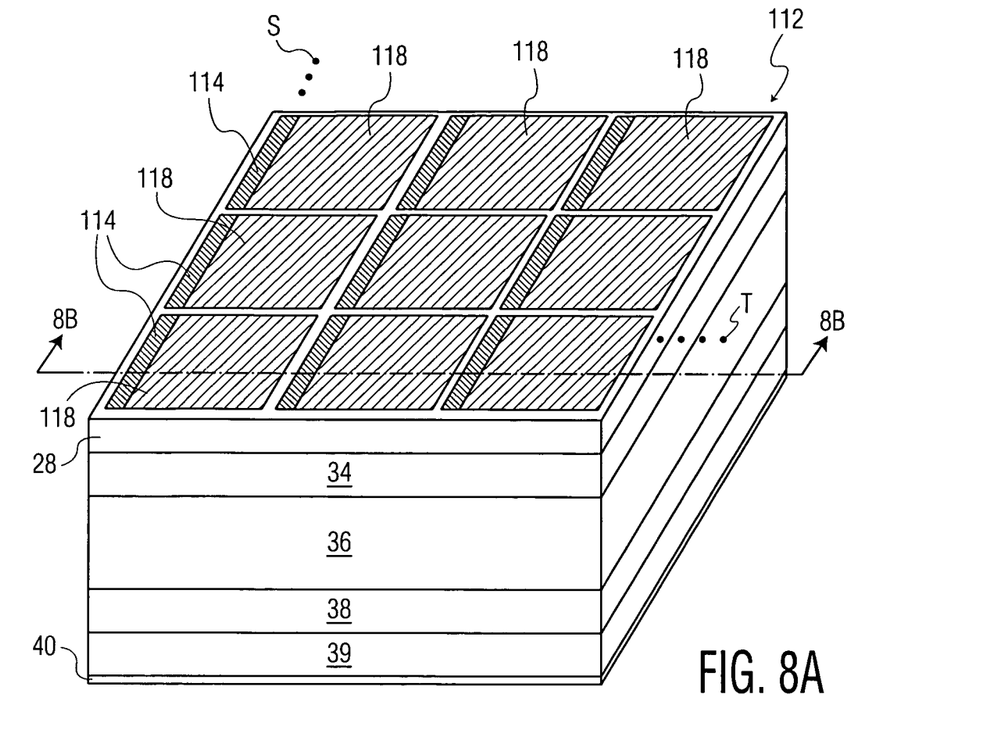
FIG. 8A shows a pictorial view of an array of S rows and T columns of photodiodes in accordance with one embodiment of the present invention.
Figure 8B:
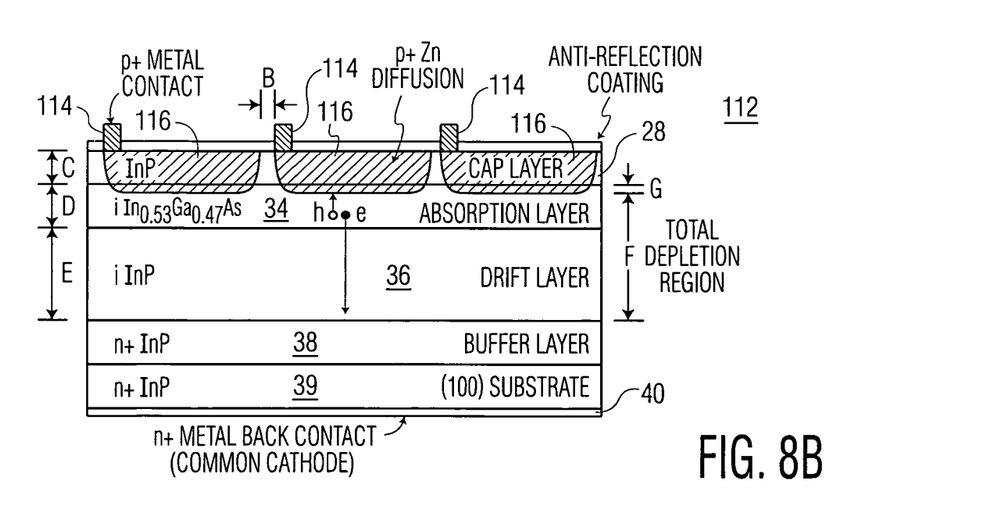
FIG. 8B is a cross sectional view taken along lines 8B-8B of FIG. 8A.

FIGS. 8A and 8B show another embodiment of the invention for an array of large area low capacitance photodiodes. Except for the p$^+$ Zn diffusion doping of cap layer areas 116 extending into absorption layer 34, the n$^+$ metal back contact (common cathode) 20, buffer layer 38, drift layer 36 and absorption layer 34 are substantially the same as described above for other embodiments of the present invention. In this embodiment, the photodiode array 112 is arranged to provide S rows and T columns of large area low capacitance photodiodes 118 each having a p$^+$ metal contact 114 (anode connection), and a square, rectangular, or circular p$^+$ doped area 116 extending into the absorption layer 34 by about 0.5 μm. Although nine photodiodes are shown for purposes of illustration, the array 112 can have up to a practical limit S times T such photodiodes 118. Note that for each photodiode space B can range in length from 5 μm to 50 μm, and the sides of each if rectangular can range in length from 0.1 mm to 10 mm, or if circular can range in diameter from 0.1 mm to 10 mm.

With reference to FIGS. 3A and 3B, a single photodiode can be obtained through producing a single quadrant 12, 14, 16 or 18. The geometry of the p$^+$ doped cap layer 28 portion 64 and underlying p$^+$ doped absorption layer 34 portion 35 can be other than pie shaped. For example, the p$^+$ doped areas 64 and 35 can be circular, square, rectangular and other shapes.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims. For example, the shape of the quad photodiode array 60 can be other than circular, such as square, rectangular, and so forth, for example. Also, the present low capacitance quad photodiode array 60 can be individually provided for use in applications other than photoreceivers. Also, the inventive photodiode structure presented herein can be modified to provide either individual low capacitance p-i-n photodiodes, or an array of such photodiodes. In addition, one such photodiode can be used to drive a single TIA for providing an improved photoreceiver relative to the prior art. Also, the Applicants recognize, as shown above, that the present low capacitance photodiode or photodiode array can be utilized for high speed applications, such as free-space communication systems.

What is claimed is:

1. A large-area low-noise quad photoreceiver comprising:
a quad InGaAs photodiode structure including:
an n$^+$ doped InP substrate having top and bottom surfaces;
a buffer layer provided by n$^+$ doped InP material deposited on the top of said substrate for reducing the capacitance to enhance the speed of said photodiode;
an n$^+$ metal back contact deposited on the bottom of said substrate, said contact serving as a common cathode for receiving a bias voltage;
an intrinsic (i) InP drift layer deposited on the top of said buffer layer;
an InGaAs absorption layer deposited on the i InP drift layer, said drift layer and said absorption layer providing low-capacitance high-speed operation;
InP cap layer deposited on said absorption layer;
said InP cap layer being divided into four quadrants of equal area, each quadrant being p$^+$ doped, the p$^+$ doping extending into a top portion of said absorption layer, with the four quadrants being spaced apart from one another and each serving as the light receiving area for an individual associated p-i-n photodiode;

an individual p⁺ metal contact being deposited in an outermost portion of each one of said four quadrants, respectively, with each contact serving as an output terminal for its associated p-i-n photodiode; and four transimpedance amplifiers (TIA) each having an individual input terminal electrically connected to an output terminal of an individual one of said p-i-n photodiodes, and each TIA having an individual output terminal.

2. The quad photoreceiver of claim 1, further including an anti-reflection coating on said cap layer between said p⁺ metal contacts.

3. The quad photoreceiver of claim 2, wherein said anti-reflection coating consists of silicon nitride.

4. The quad photoreceiver of claim 1, wherein said p⁺ doped quadrants of said cap layer are doped via p+ Zn diffusion.

5. The quad photoreceiver of claim 4, wherein the p⁺ doped Zn diffusion of each quadrant of said cap layer extends 0.5 μm into a top portion of said absorption layer.

6. The quad photoreceiver of claim 1, wherein:
said drift layer ranges in thickness from 1.0 μm to 10 μm;
said absorption layer ranges in thickness from 1 μm to 3 μm; and
said cap layer ranges in thickness from 0.1 μm to 1.0 μm.

7. The quad photoreceiver of claim 1, wherein each of said four quadrants of said cap layer are one-quarter pie shaped.

8. The quad photoreceiver of claim 7, wherein said quad InGaAs photodiode structure has an active area ranging from 0.1 mm to 10 mm in size for receiving a light signal.

9. The quad photoreceiver of claim 8, wherein said quad InGaAs photodiode structure has a separation or space between quadrants ranging from 5 μm to 50 μm.

10. The quad photoreceiver of claim 1, wherein topmost 0.5 μm portions of said absorption layer underlying said quadrant of said cap layer are p-doped to an acceptor concentration of about $1 \times 10^{18}$ cm$^{-3}$.

11. A large-area low-noise quad photoreceiver comprising:
a quad InGaAs photodiode structure including:
an n⁺ doped InP substrate having top and bottom surfaces;
an n⁺ doped InP buffer layer deposited on the top of said substrate for reducing the capacitance to enhance the speed of said photodiode;
an n⁺ metal back contact deposited on the bottom of said substrate, said contact serving as a common cathode for receiving a bias voltage;
an intrinsic (i) InP drift layer ranging in thickness from 1 μm to 10 μm deposited on the top of said buffer layer;
an InGaAs absorption layer ranging in thickness from 1 μm to 3 μm deposited on the i InP drift layer, said drift layer and said absorption layer providing low-capacitance high-speed operation;
an InP cap layer ranging in thickness form 0.1 μm to 1 μm deposited on said absorption layer;
said InP cap layer being divided into four quadrants of equal area, each quadrant being p⁺ doped, the p⁺ doping extending into a top portion of said absorption layer, with the four quadrants being spaced apart from one another and each serving as the light receiving area for an individual associated p-i-n photodiode;
topmost 0.5 μm portions of said absorption layer underlying each quadrant of said cap layer are p⁺ doped to an acceptor concentration of about $1 \times 10^{18}$ cm$^{-3}$;
an individual p⁺ metal contact being deposited in an outermost portion of each one of said four quadrants, respectively, with each contact serving as an output terminal for its associated p-i-n photodiode; and
four transimpedance amplifiers (TIA) each having an individual input terminal electrically connected to an output terminal of an individual one of said p-i-n photodiodes, and each TIA having an individual output terminal.

12. The photoreceiver of claim 11, wherein an uppermost portion of said p⁺ doped cap layer said photodiode structure is circular with a diameter ranging from 0.1 mm to 10 mm, with each one of said from quadrants of said cap layer being one-quarter pie shaped, and spaced apart by 20 μm from one another.

13. A large-area low-capacitance quad photodiode array comprising:
an n⁺ doped InP substrate having top and bottom surfaces;
a buffer layer provided by n⁺ doped InP material deposited on the top of said substrate for reducing the capacitance to enhance the speed of said photodiode;
an n⁺ metal back contact deposited on the bottom of said substrate, said contact serving as a common cathode for receiving a bias voltage;
an intrinsic (i) InP drift layer deposited on the top of said buffer layer;
an InGaAs absorption layer deposited on the i InP drift layer, said drift layer and said absorption layer providing low-capacitance high-speed operation;
an InP cap layer deposited on said absorption layer;
said InP cap layer being divided into four quadrants of equal area, each quadrant being p⁺ doped, the p⁺ doping extending into a top portion of said absorption layer, with the four quadrants being spaced apart from one another and each serving as the light receiving area for an individual associated p-i-n photodiode; and
an individual p⁺ metal contact being deposited in an outermost portion of each one of said four quadrants, respectively, with each contact serving as an output terminal for its associated p-i-n photodiode.

14. The quad photodiode array of claim 13, further including an anti-reflection coating on said cap layer between said p⁺ metal contacts.

15. The quad photodiode array of claim 14, wherein said anti-reflection coating consists of silicon nitride.

16. The quad photodiode array of claim 13, wherein said p⁺ doped quadrants of said cap layer are doped via p⁺ Zn diffusion.

17. The quad photodiode array of claim 16, wherein the p⁺ doped Zn diffusion of each quadrant of said cap layer extends 0.5 μm into a top portion of said absorption layer.

18. The quad photodiode array of claim 13, wherein:
said drift layer ranges in thickness from 1 μm to 10 μm thick;
said absorption layer ranges in thickness from 1.0 μm to 3 μm; and
the cap layer ranges in thickness from 0.1 μm to 1 μm.

19. The quad photodiode array of claim 13, wherein each of said four quadrants of said cap layer are one-quarter pie shaped.

20. The quad photodiode array of claim 19, wherein said quad InGaAs photodiode structure has an active area ranging from 0.1 mm to 10 mm for receiving a light signal.

21. The photodiode array of claim 20, wherein said InGaAs photodiode structure has a separation or space between said plurality of areas of said cap layer ranging from 5 μm to 50 μm.

22. The quad photodiode array of claim 20, wherein said quad InGaAs photodiode structure has a separation or space between quadrants ranging from 5 μm to 50 μm.

23. The quad photodiode array of claim 13, wherein topmost 0.5 μm portions of said absorption layer underlying said quadrant of said cap layer are p-doped to an acceptor concentration of about $1\times10^{18}$ cm$^{-3}$.

24. A large-area low-capacitance quad photodiode array comprising:
an n$^+$ doped InP substrate having top and bottom surfaces;
an n$^+$ doped InP buffer layer deposited on the top of said substrate for reducing the capacitance to enhance the speed of said photodiode;
an n$^+$ metal back contact deposited on the bottom of said substrate, said contact serving as a common cathode for receiving a bias voltage;
an intrinsic (i) InP drift layer ranging in thickness from 1 μm to 10 μm deposited on the top of said buffer layer;
an InGaAs absorption layer ranging in thickness from 1 μm to 3 μm deposited on the i InP drift layer, said drift layer and said absorption layer providing low-capacitance high-speed operation;
an InP cap layer ranging in thickness form 0.1 μm to 1 μm deposited on said absorption layer;
said InP cap layer being divided into four quadrants of equal area, each quadrant being p$^+$ doped, the p$^+$ doping extending into a top portion of said absorption layer, with the four quadrants being spaced apart from one another and each serving as the light receiving area for an individual associated p-i-n photodiode;
topmost 0.5 μm portions of said absorption layer underlying each quadrant of said cap layer are p$^+$ doped to an acceptor concentration of about $1\times10^{18}$ cm$^{-3}$; and
an individual p$^+$ metal contact being deposited in an outermost portion of each one of said four quadrants, respectively, with each contact serving as an output terminal for its associated p-i-n photodiode.

25. The photodiode array of claim 24, wherein said cap layer is circular with a diameter ranging from 0.1 mm to 10 mm, with each one of said from quadrants of said cap layer being one-quarter pie shaped, and spaced apart in a range of from 5 μm to 50 μm from one another.

26. A large-area low-capacitance p-i-n photodiode comprising:
an n$^+$ doped InP substrate having top and bottom surfaces;
an n$^+$ doped InP buffer layer deposited on the top of said substrate for reducing the capacitance to enhance the speed of said photodiode;
an n$^+$ metal back contact deposited on the bottom of said substrate, said contact serving as a common cathode for receiving a bias voltage;
an intrinsic (i) InP drift layer ranging in thickness from 1 μm to 10 μm deposited on the top of said buffer layer;
an InGaAs absorption layer ranging in thickness from 1 μm to 3 μm deposited on the i InP drift layer, said drift layer and said absorption layer providing low-capacitance high-speed operation;
an InP cap layer ranging in thickness from 0.1 μm to 1.0 μm deposited on said absorption layer;
said InP cap layer being p$^+$ doped, the p$^+$ doping extending into a top portion of said absorption layer, with said cap layer serving as the light receiving area ranging from 0.008 mm$^2$ to 100 mm$^2$;
a topmost 0.5 μm portion of said absorption layer underlying said cap layer are p$^+$ doped to an acceptor concentration of about $1\times10^{18}$ cm$^{-3}$; and
an individual p$^+$ metal contact being deposited in an outermost portion of said cap layer serving as an output terminal.

27. The photodiode of claim 26, wherein said cap layer is circular.

28. A large-area low-capacitance photodiode array comprising:
an n$^+$ doped InP substrate having top and bottom surfaces;
an n$^+$ doped InP buffer layer deposited on the top of said substrate for reducing the capacitance to enhance the speed of said photodiode;
an n$^+$ metal back contact deposited on the bottom of said substrate, said contact serving as a common cathode for receiving a bias voltage;
an intrinsic (i) InP drift layer deposited on said buffer layer;
an InGaAs absorption layer deposited on the i InP drift layer, said drift layer and said absorption layer providing low-capacitance high-speed operation;
an InP cap layer deposited on said absorption layer;
said InP cap layer being divided into a plurality of areas, each area being p$^+$ doped, the p$^+$ doping extending into a top portion of said absorption layer, with the plurality of areas being spaced apart from one another and each serving as the light receiving area for an individual associated p-i-n photodiode; and
an individual p$^+$ metal contact being deposited in an outermost portion of each one of said plurality of areas, respectively, with each contact serving as an output terminal for its associated p-i-n photodiode.

29. The photodiode array of claim 28, further including an anti-reflection coating on said cap layer between said p$^+$ metal contacts.

30. The photodiode array of claim 29, wherein said anti-reflection coaxing consists of silicon nitride.

31. The photodiode array of claim 28, wherein said p$^+$ doped plurality of areas of said cap layer are each doped via p$^+$ Zn diffusion.

32. The photodiode array of claim 31, wherein the p$^+$ doped Zn diffusion of each area of said cap layer extends 0.5 μm into a top portion of said absorption layer.

33. The photodiode array of claim 28, wherein:
said drift layer ranges in thickness from 1 μm to 10 μm thick;
said absorption layer ranges in thickness from 1.0 μm to 3 μm; and
the cap layer ranges in thickness from 0.1 μm to 1 μm.

34. The photodiode array of claim 28, wherein each of said plurality of areas of said cap layer are rectangular.

35. The photodiode array of claim 28, wherein topmost 0.5 μm portions of said absorption layer underlying said plurality of areas of said cap layer are p-doped to an acceptor concentration of about $1\times10^{18}$ cm$^{-3}$.

36. A large-area low-capacitance photodiode array comprising:
a buffer layer provided by n$^+$ doped InP substrate having top and bottom surfaces for reducing the capacitance to enhance the speed of said photodiode;
an n$^+$ metal back contact deposited on the bottom of said substrate, said contact serving as a common cathode for receiving a bias voltage;
an intrinsic (i) InP drift layer ranging in thickness from 1 μm to 10 μm deposited on the top of said buffer layer;
an InGaAs absorption layer ranging in thickness from 1 μm to 3 μm deposited on the i InP drift layer, said drift layer and said absorption layer providing low-capacitance high-speed operation;

an InP cap layer ranging in thickness from 0.1 μm to 1.0 μm deposited on said absorption layer;

said InP cap layer being divided into a plurality of areas, each area being p$^+$ doped, the p$^+$ doping extending into a top portion of said absorption layer, with the plurality of areas being spaced apart from one another and each serving as the light receiving area for an individual associated p-i-n photodiode;

topmost 0.5 μm portions of said absorption layer underlying each area of said cap layer are p$^+$ doped to an acceptor concentration of about $1 \times 10^{18}$ cm$^{-3}$; and an individual p$^+$ metal contact being deposited in an outermost portion of each one of said plurality of areas, respectively, with each contact serving as an output terminal for its associated p-i-n photodiode.

37. The photodiode array of claim 36, wherein said plurality of areas of said cap layer are each rectangularly shaped, and are spaced apart from one another in a range of 5 μm to 50 μm.

* * * * *